(12) United States Patent
Khor

(10) Patent No.: US 9,530,835 B1
(45) Date of Patent: Dec. 27, 2016

(54) INTEGRATED CIRCUITS WITH GUARD RING STRUCTURES FOR NONPLANAR TRANSISTOR DEVICES

(71) Applicant: Altera Corporation, San Jose, CA (US)

(72) Inventor: Chin Hieang Khor, Simpang Ampat (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/837,992

(22) Filed: Aug. 27, 2015

(51) Int. Cl.
*H01L 29/06* (2006.01)
*H01L 29/78* (2006.01)

(52) U.S. Cl.
CPC ......... *H01L 29/0619* (2013.01); *H01L 29/785* (2013.01)

(58) Field of Classification Search
CPC .................... H01L 29/0619; H01L 29/785
See application file for complete search history.

(56) References Cited

U.S. PATENT DOCUMENTS

| | | | |
|---|---|---|---|
| 6,160,303 A | 12/2000 | Fattaruso | |
| 6,927,345 B2 * | 8/2005 | Wu | G03F 1/40 174/255 |
| 8,097,925 B2 | 1/2012 | Jensen et al. | |
| 9,123,810 B2 * | 9/2015 | Hong | H01L 29/785 |
| 2014/0141586 A1 | 5/2014 | Hu et al. | |
| 2014/0264607 A1 | 9/2014 | Basu et al. | |
| 2015/0021713 A1 | 1/2015 | Cheng et al. | |
| 2015/0061077 A1 | 3/2015 | Cheng et al. | |
| 2016/0056230 A1 * | 2/2016 | Lin | H01L 21/76 257/491 |

* cited by examiner

*Primary Examiner* — William Coleman
(74) *Attorney, Agent, or Firm* — Treyz Law Group; Jason Tsai

(57) ABSTRACT

Integrated circuits with guard rings are provided. Integrated circuits may include functional circuitry that is sensitive to random noise sources. The functional circuitry may be formed using nonplanar transistor devices such as FinFET devices. A nonplanar guard ring may be provided that help isolate the functional circuitry from the interfering noise sources. The nonplanar guard ring may include edges that are formed using long rectangular strips of diffusion regions and/or smaller interleaved L-shaped diffusion regions. At least two columns of multiple interlocking pairs of L-shaped diffusion regions or at least one column of staggered L-shaped diffusion regions can be formed along an edge of the nonplanar guard ring to help ensure proper noise leakage protection between adjacent L-shaped diffusion regions along that edge.

19 Claims, 9 Drawing Sheets

INTEGRATED CIRCUITS WITH GUARD RING STRUCTURES FOR NONPLANAR TRANSISTOR DEVICES

BACKGROUND

This relates to integrated circuits, and more particularly, to integrated circuits with guard rings.

Integrated circuits typically include digital circuitry, analog circuitry, and/or other functional circuitry formed in a semiconductor substrate. In a typical scenario, the internal circuitry within an integrated circuit is coupled to external equipment through input-output pads. Noise can potentially leak from the external equipment through the pads onto the internal circuitry. Noise entering an integrated circuit via the input-output pads or noise from one active/aggressor circuit to another victim circuit within the integrated circuit can degrade circuit performance, particularly in high-speed applications.

In an effort to provide better noise isolation, integrated circuits are often provided with guard rings. For example, a guard ring may be formed around the internal circuitry to help block noise leaking into the integrated circuit from the external equipment. As another example, a guard ring may be formed around a sensitive circuit to isolate that sensitive circuit from noise or interference generated from nearby circuitries on the integrated circuit.

Conventional guard rings that are formed on integrated circuits with planar complementary metal-oxide-semiconductor (CMOS) transistors (i.e., transistors having polysilicon gate conductors formed over a planar substrate on a gate oxide liner) are formed by implanting dopants into the planar substrate to construct diffusion regions in wells of the same doping type. For example, a p+ diffusion region is formed in a p-well to form a p+ guard ring, whereas an n+ diffusion region is formed in an n-well to form an n+ guard ring. High density Ohmic contacts are formed directly on the n+/p+ diffusion regions to help bias the diffusion region to appropriate voltage levels. Conventional guard rings formed in this way can be formed as a solid continuous (i.e., non-broken) ring structure around a particular circuit that is being isolated.

To provide improved control of transistor devices at smaller technology nodes, multi-gate "non-planar" transistor structures such as Fin field-effect transistors (FinFETs) have been developed. Fabrication design rules for FinFETs, however, limit the width of the diffusion regions. As a result, a guard ring formed on an integrated circuit with FinFET devices cannot be formed as a solid continuous ring structure and will therefore exhibit gaps along the periphery of the guard ring. Noise propagating through these gaps can severely limit circuit performance, especially when the substrate exhibits low resistance, which is typical for the FinFET processing technology.

It is within this context that the embodiments herein arise.

SUMMARY

An integrated circuit that includes nonplanar transistors such as Fin field-effect transistors (FinFETs) or other types of multi-gate devices is provided. In accordance with an embodiment, the integrated circuit may include a guard ring that is formed surrounding the nonplanar transistor and that is configured to eliminate any direct noise leakage path between the nonplanar transistor and circuitry outside of the guard ring.

The guard ring may have a periphery and may include multiple discrete diffusion regions formed along its periphery. A first edge along its periphery may include substantially rectangular strips of diffusion regions. A second edge along its periphery may include a plurality of interleaved non-rectangular diffusion regions. The interleaving non-rectangular diffusion regions may be L-shaped diffusion regions, T-shaped diffusion regions, Z-shaped diffusion regions, cross-shaped diffusion regions, or other suitably shaped diffusion regions.

In one suitable arrangement, the plurality of interleaved non-rectangular diffusion regions may include pairs of interlocking L-shaped diffusion regions. In another suitable arrangement, the plurality of interleaved non-rectangular diffusion regions may include staggered L-shaped diffusion regions. If desired, the second edge of the guard ring may further include an additional plurality of interleaved non-rectangular diffusion regions, where the plurality of interleaved non-rectangular diffusion regions and the additional plurality of interleaved non-rectangular regions are laterally offset with respective to one another to help eliminate any direct noise leakage path through the nonplanar guard ring.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

DETAILED DESCRIPTION

Embodiments of the present invention relate to integrated circuits and more particularly, to integrated circuits with guard rings. It will be recognized by one skilled in the art, that the present exemplary embodiments may be practiced without some or all of these specific details. In other instances, well-known operations have not been described in detail in order not to unnecessarily obscure the present embodiments.

Integrated circuits include circuitry formed in a semiconductor substrate such as a silicon substrate. The circuitry on an integrated circuit may be sensitive to noise that leaks into the integrated circuit from off-chip or noise generated by neighboring circuits within the integrated circuit. Such types of noise can degrade the performance of an integrated circuit and is a critical factor especially for high-speed systems. In an effort to provide noise protection, noise isolation structures sometimes referred to as guard rings formed in the substrate may serve to isolate regions of circuitry from each other by blocking noise, leakage currents, and/or other sources of interference.

Figure 1:
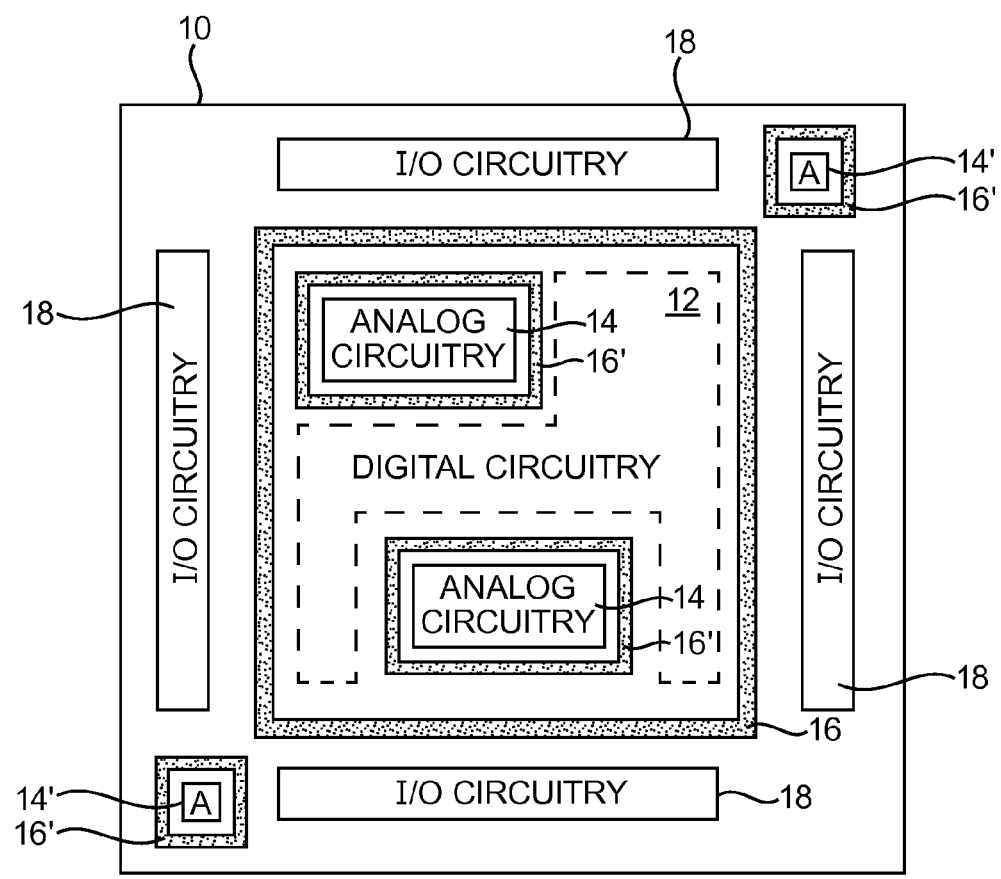
FIG. 1 is a diagram of an illustrative integrated circuit that includes guard ring structures in accordance with an embodiment.

FIG. 1 shows an integrated circuit that includes digital circuitry 12, analog circuitry 14, and other circuitry formed in a substrate (e.g., a p-type silicon substrate). Integrated circuit 10 may include input-output (I/O) circuitry such as I/O circuitry 18 formed on each side of integrated circuit 10. I/O circuitry 18 may include pads and other I/O blocks that allow integrated circuit 10 to communicate with external (off-chip) components.

Noise may leak from the external components onto integrated circuit 10 through I/O circuitry 18. A primary guard ring such as guard ring 16 may surround the internal circuitry (e.g., digital circuitry 12, analog circuitry 14, etc.) to prevent the noise from the external components from affecting the operations of the internal circuitry.

Analog circuitry 14 may each have a dedicated guard ring such as guard ring 16'. Guard ring 16' may serve to isolate the analog circuitry from the digital circuitry so that interference between the analog circuitry and the digital circuitry is minimized. Peripheral analog circuitry such as analog circuitry 14' may be located at the corners of integrated circuit 10. Analog circuits 14' may each have a respective dedicated guard ring 16', if desired. In general, any circuitry that is sensitive to noise or other disturbances may be surrounded by a guard ring to help isolate the sensitive circuitry from undesired noise sources.

Figure 2:
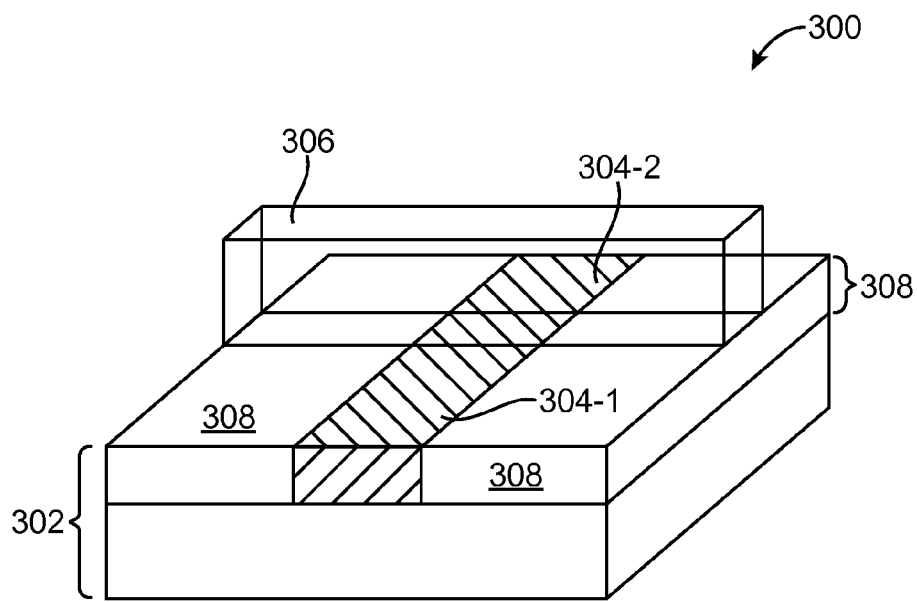
FIG. 2 is a perspective view of an illustrative planar transistor in accordance with an embodiment of the present invention.
Figure 3:
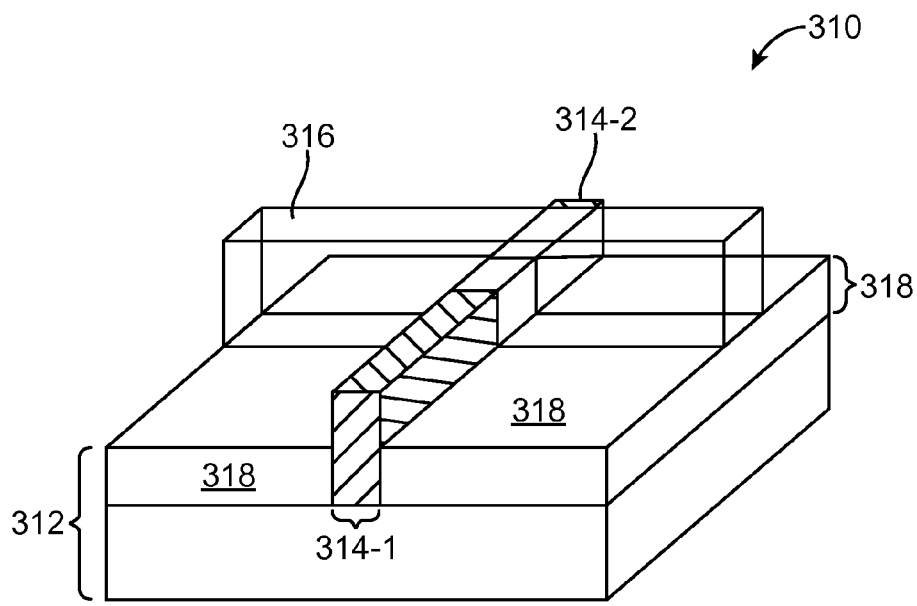
FIG. 3 is a perspective view of an illustrative non-planar transistor in accordance with an embodiment of the present invention.

Guard rings may be formed in integrated circuits with planar transistors or integrated circuits with nonplanar transistors. Due to differences in the way planar and non-planar transistor devices are fabricated on a piece of substrate, guard rings on integrated circuits with planar transistors and guard rings on integrated circuits with nonplanar transistors may be imposed with different structural and manufacturing requirements. FIGS. 2 and 3 help illustrate basic differences between a planar transistor and a nonplanar transistor.

A planar transistor such as planar transistor 300 is shown in FIG. 2. Transistor 300 may be formed in a semiconductor substrate 302 (e.g., a p-type silicon substrate). A conductive gate structure 306 (e.g., a polysilicon gate conductor) may be disposed on substrate 302. Diffusion regions 304-1 and 304-2 may be formed on each side of gate structure 306 in the surface of substrate 302. Regions 304-1 and 304-2 may serve as source-drain regions for transistor 300. The portion of substrate 302 that lies directly beneath gate conductor 306 and between source-drain regions 304-1 and 304-2 may serve as the channel of transistor 300. Areas in substrate 302 that are not transistor diffusion or channel regions may be occupied by shallow trench isolation structures 308 that are filled with dielectric material such as silicon oxide.

FIG. 3 shows a perspective view of a nonplanar transistor in accordance with an embodiment of the present invention. As shown in FIG. 3, transistor 310 may be formed on a semiconductor substrate 312. Transistor 310 may have a fin-shaped member that includes fin portions 314-1 and 314-2, that is integral with substrate 312, and that protrudes from the surface of substrate 312. A conductive gate structure 316 may be disposed over substrate 312 and wraps around a portion of the protruding fin member. The portion of the fin that is covered by gate structure 316 may serve as the channel region of transistor 310, whereas portions of the fin member on either side of gate 316 (e.g., fin portions 314-1 and 314-2) may serve as source-drain regions for transistor 310. Areas in substrate 312 that are not source-drain or channel regions may be occupied by a layer of dielectric material 318 (e.g., a layer of silicon oxide). Transistor 310 formed in this way is therefore sometimes referred to as a Fin field effect transistor (FinFET) or a "multi-gate" transistor.

Figure 4:
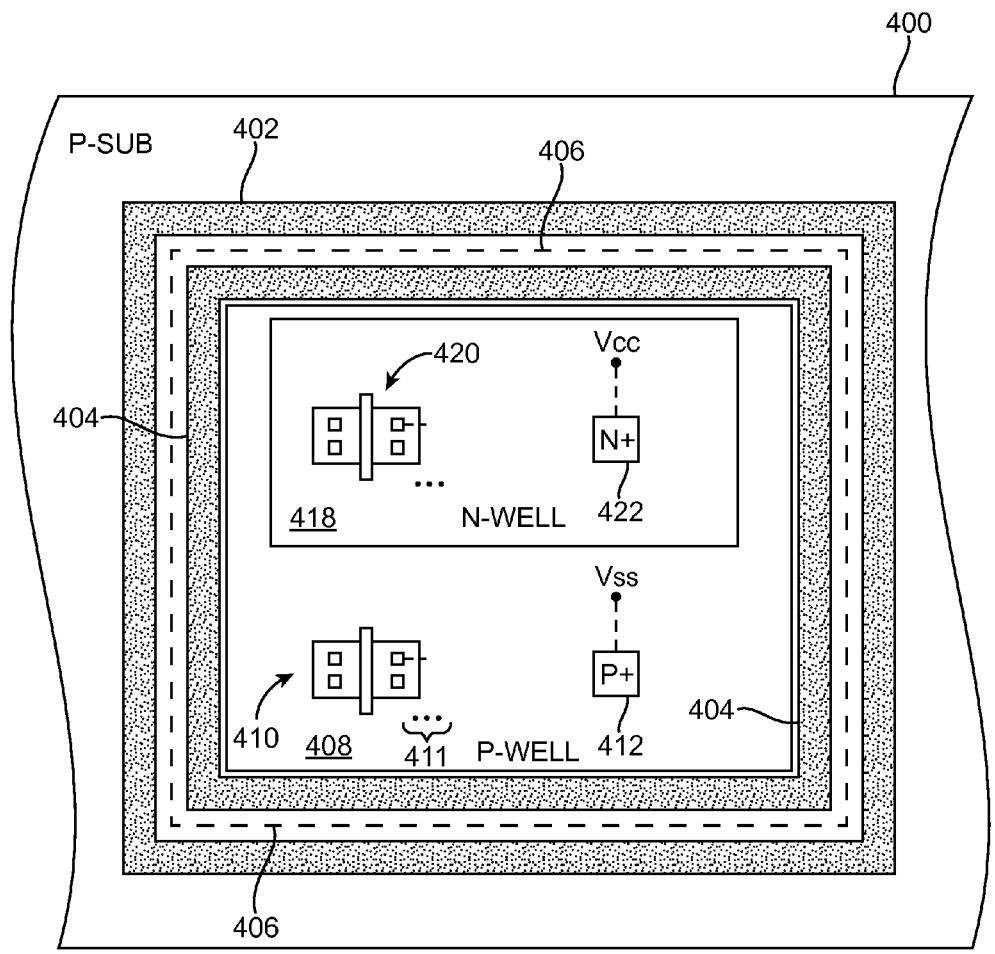
FIG. 4 is a top view showing guard ring structures that are formed surrounding planar transistor devices.

FIG. 4 is a top layout view showing guard ring structures that are formed around planar transistor devices. Such types of guard rings are sometimes referred to as planar guard rings. As shown in FIG. 4, an n-channel metal-oxide-semiconductor (NMOS) transistor such as NMOS transistor 410 and a p-channel metal-oxide-semiconductor (PMOS) transistor such as PMOS transistor 420 are formed in a semiconductor substrate 400 (e.g., a p-type silicon substrate). The NMOS transistor 410 is formed in a p-well 408, whereas the PMOS transistor 420 is formed in an n-well 418. In this particular example, n-well 418 is formed within p-well 408. P-well 408 is typically biased to ground power supply voltage Vss using a p+ well tap 412 while n-well 418 is biased to positive power supply voltage Vcc using an n+ well tap 422. In general, more than one PMOS transistor can be formed within n-well 418, and more than one NMOS transistor can be formed within p-well 408 (as indicated by dots 411).

A deep n-well such as deep n-well 406 may be formed beneath p-well 408. A planar n+ guard ring 404 can be formed above the deep n-well 406 and surrounding p-well 408. The n+ guard ring 404 is an n+ diffusion region formed in an n-well. The n+ diffusion region is biased to the positive power supply voltage via a plurality of high density Ohmic contacts formed directly on the n+ diffusion region. A planar p+ guard ring 402 can be formed surrounding n+ guard ring 404. The p+ guard ring 402 is a p+ diffusion region formed directly in p-type substrate 400 or in a separate p-well. The p+ diffusion region is biased to the ground power supply voltage via a plurality of high density Ohmic contacts formed directly on the p+ diffusion region.

As shown in FIG. 4, the n+ planar guard ring 404 and the p+ planar guard ring 402 can be formed as solid unbroken wall structures surrounding the NMOS and PMOS transistors (e.g., the n+ planar guard ring 404 can be formed as a continuous ring-shaped n+ diffusion region, whereas the p+ planar guard ring 402 can be formed as a continuous ring-shaped p+ diffusion region).

Figure 5:
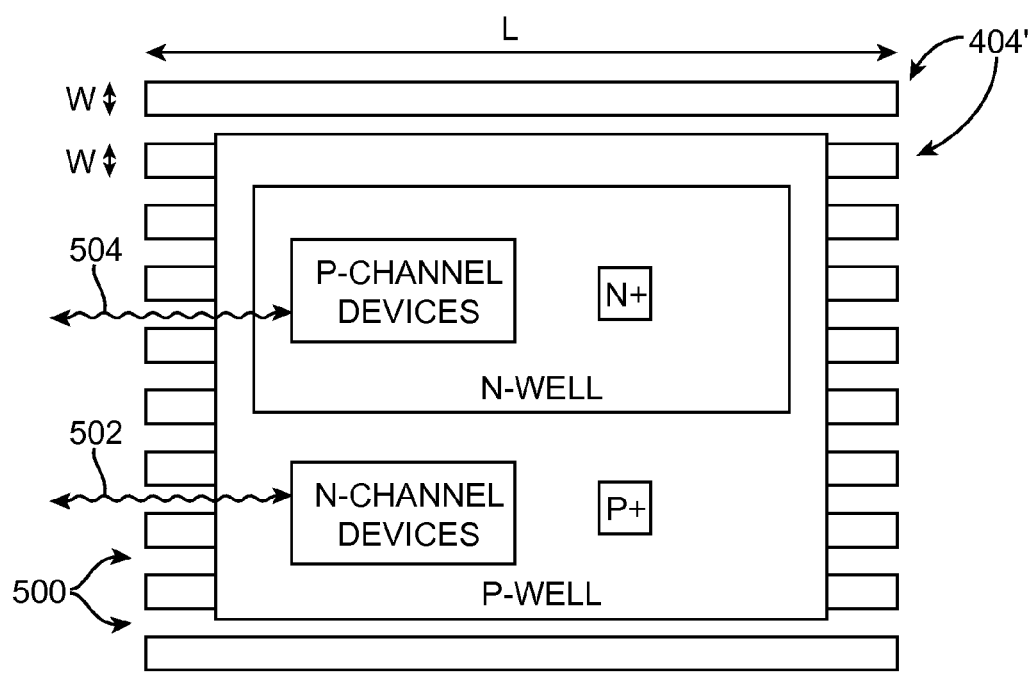
FIG. 5 is a top view showing guard ring structures that can be formed around non-planar transistor devices in accordance with an embodiment.

FIG. 5 is a top view showing guard ring structures that can be formed around non-planar transistor devices (e.g., FinFET devices or multi-gate devices). Such types of guard rings are therefore sometimes referred to as nonplanar guard rings or FinFET guard rings. N-channel nonplanar transistors may be formed in a p-well, whereas p-channel nonplanar transistors may be formed in an n-well.

In the example of FIG. 5, an n+ nonplanar guard ring 404' may be formed surrounding the p-well. In contrast to the process technology that is used to form planar guard rings, fabrication design rules for manufacturing nonplanar integrated circuit structures limit the maximum width of a single diffusion region that can be formed in a semiconductor substrate. As shown in FIG. 5, each diffusion region of guard ring 404' may have no limitation on its length L (such as, e.g., the continuous diffusion regions that form the top and bottom edges of guard ring 404') but may have a limitation on its maximum allowable width W. Since there is a minimum separation that needs to exist between separate adjacent diffusion regions (as governed by design rule constraints set by the processing technology), the left and right edges of guard ring 404' may exhibit gaps 500 through which noise or other sources of interference can potentially enter into or exit from the nonplanar transistor components inside the guard ring 404' (as indicated by arrows 502 and 504). It would therefore be desirable to provide improved nonplanar guard ring structures for preventing such type of noise leakage.

Figure 6:
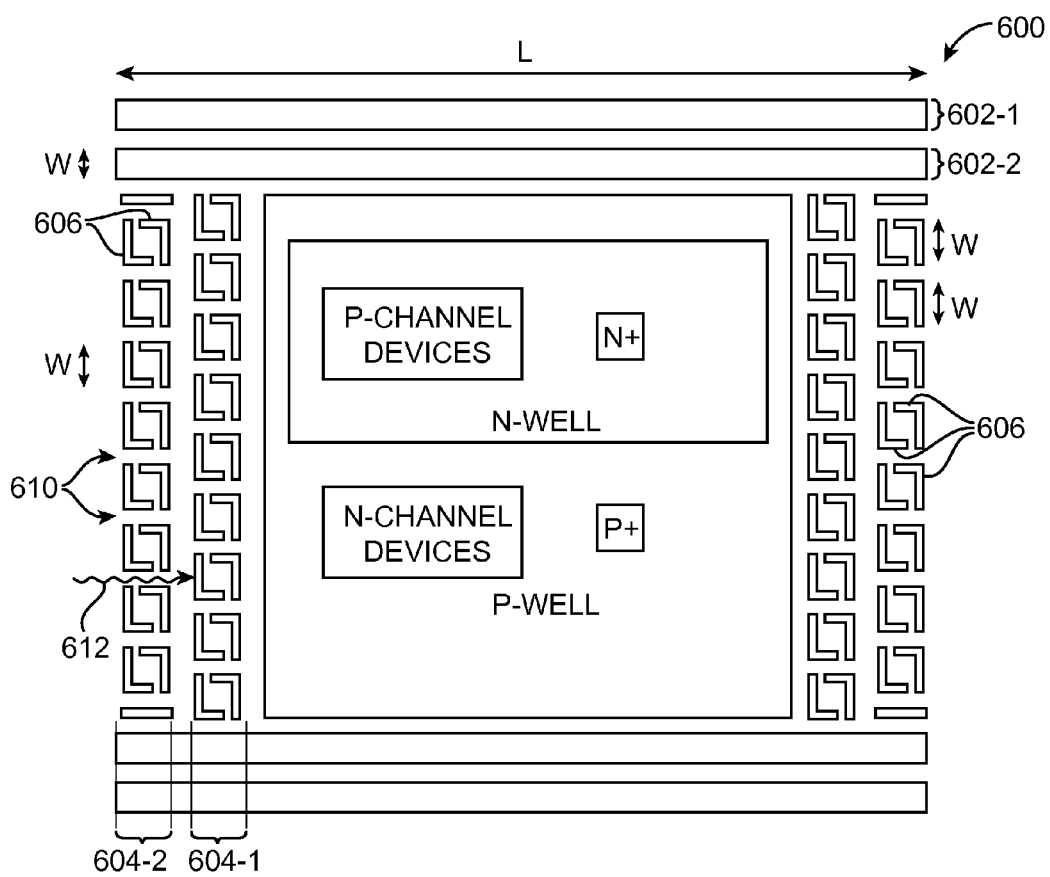
FIG. 6 is a top view showing an illustrative guard ring having edges that are formed using multiple diffusion columns in accordance with an embodiment.

In accordance with an embodiment of the present invention, a nonplanar guard ring is provided that can be used to effectively shield nonplanar transistors such as FinFETs from noise leakage. FIG. 6 is a top view showing an illustrative nonplanar guard ring 600 having edges that are formed using multiple diffusion columns and multiple diffusion rows. Nonplanar guard ring 600 may be used to isolate p-channel FinFET devices formed in an n-well and re-channel FinFET devices formed in a p-well.

As shown in FIG. 6, the top edge of guard ring 600 may be formed using two continuous rows (or strips) of diffusion regions (e.g., contiguous diffusion strips 602-1 and 602-2). Each diffusion strip 602 may have any suitable length L but may be limited to a maximum width W (as set by FinFET design/fabrication constraints). The total width of the top edge of guard ring 600 may be set by the number of rows of diffusion strips 602. For example, a thicker edge may be formed by using three or more rows of diffusion strips 602. If desired, a thinner edge may be formed by using only one row of diffusion strip 602. The bottom edge of guard ring 600 may be formed in a similar fashion using one or more rows of diffusion strips. Each row of diffusion strips 602 is a contiguous diffusion region.

Still referring to FIG. 6, the left edge of guard ring 600 may be formed using two columns of discrete diffusion regions (e.g., first diffusion column 604-1 and second diffusion column 604-2). In the example of FIG. 6, each diffusion column 604 may include multiple interleaved L-shaped diffusion regions 606. Each of the individual L-shaped diffusion regions 606 may exhibit a height that is equal to or less than the maximum diffusion width W and will therefore satisfy the design rule constraints associated with the fabrication of FinFET and other types of nonplanar or multi-gate transistor devices.

Even though there may still be gaps such as gaps 610 that exist between adjacent L-shaped regions 606 in a single column 604, the L-shaped regions 606 in the two diffusion columns may be laterally offset to ensure that there is no direct path for noise to leak through the left edge of guard ring 600 (as indicated by arrow 612). The total width of the left edge of guard ring 600 may be set by the number of diffusion columns 604. For example, a thicker edge may be formed by using three or more columns of laterally offset diffusion columns 604. The right edge of guard ring 600 may be formed in a similar fashion using one or more columns of L-shaped diffusion regions 606. The desired, the top and bottom edges of guard ring 600 may also be formed using L-shaped diffusion regions for uniformity along the entire periphery of the guard ring. The terms "rows" and "columns" described herein are merely illustrative and can sometimes be used interchangeably depending on the orientation of guard ring 606.

Configured in this way, guard ring 600 may be used to effectively isolate sensitive circuitry from substrate noise and/or to effectively prevent noise generated by the circuitry within the guard ring from affecting the performance of near-by circuits outside of the guard ring. Moreover, guard ring 600 may also serve to reduce bulk resistance, which can help minimize the threshold voltage variation among the nonplanar transistors within the guard ring. In other scenarios, guard ring 600 may be used to protect against inadvertently high-frequency signal undershoot or overshoot that can sometimes be presented at the input-output pins of integrated circuit 10 (FIG. 1) and can therefore help protect against circuit latch-up.

Figure 7:
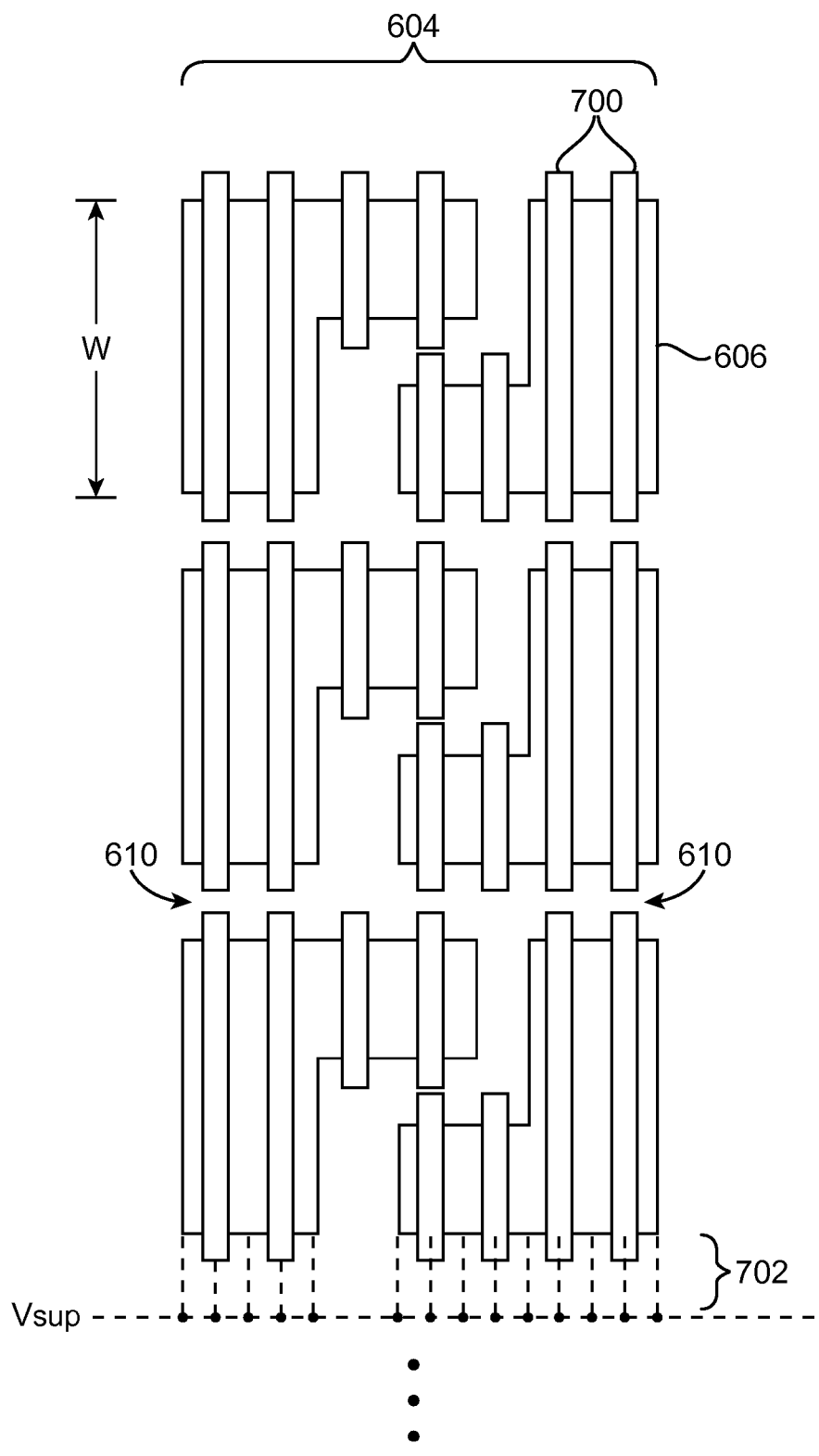
FIG. 7 is a diagram of an illustrative guard ring column having interlocking pairs of L-shaped diffusion regions in accordance with an embodiment.

FIG. 7 shows one suitable arrangement of a guard ring diffusion column 604 that includes interlocking pairs of L-shaped diffusion regions 606. As shown in FIG. 7, each pair of L-shaped diffusion regions 606 may be flipped with respect to one another (e.g., each pair of interlocked L-shaped regions may be symmetrical with respect to one another). Multiple gate structures such as gate conductors 700 may be formed over diffusion regions 606.

Figure 8:
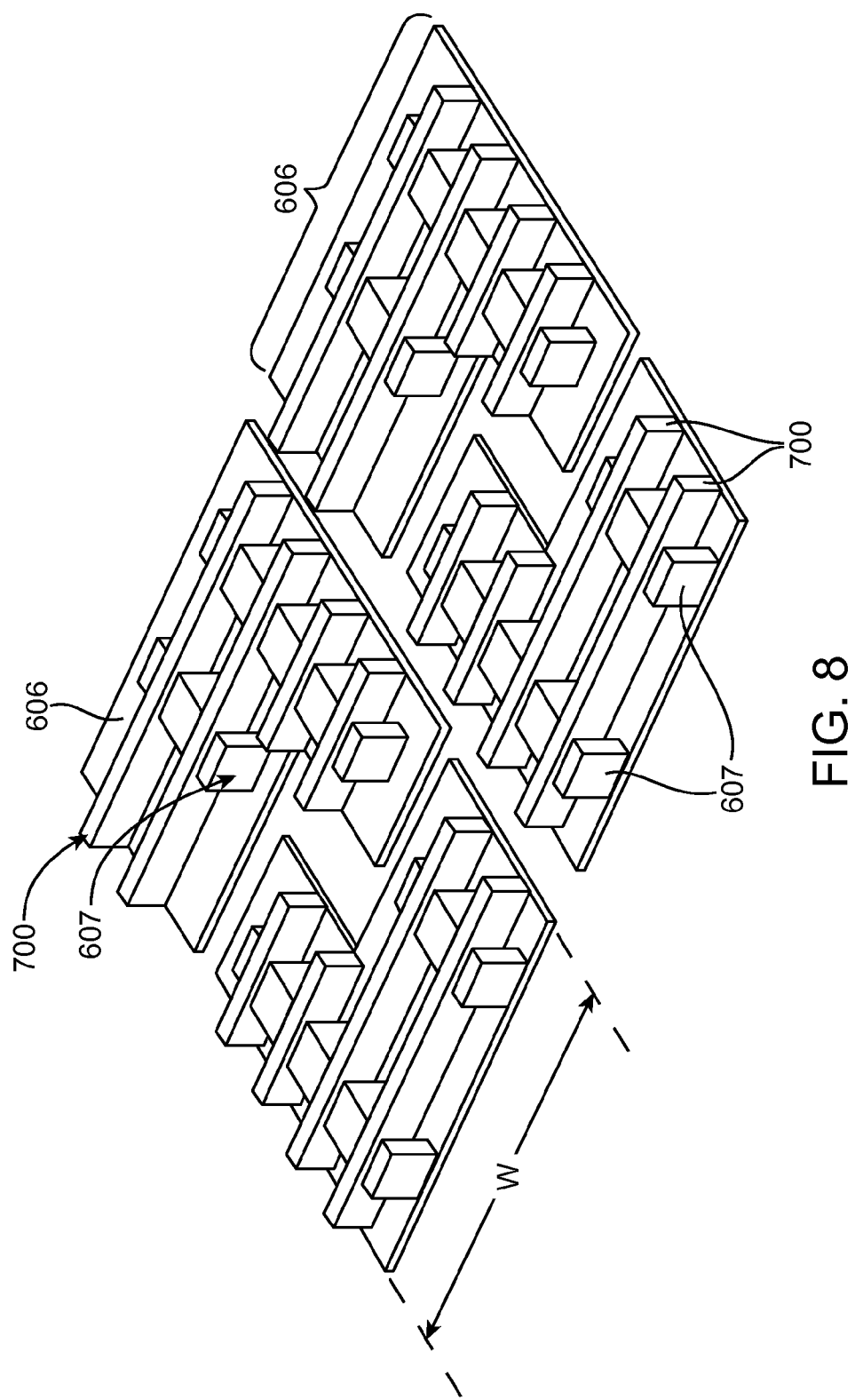
FIG. 8 is a perspective view of the guard ring diffusion column of FIG. 7 in accordance with an embodiment.

FIG. 8 is a perspective view of the guard ring diffusion column of FIG. 7. As shown in the perspective view of FIG. 8, two source-drain fin structures 607 may be formed under the gate conductors 700 in each diffusion region 606. The formation of gate conductors 700 in the guard ring helps comply with polysilicon density requirements on the integrated circuit, whereas fin structures 607 are formed to be consistent with the remaining transistor structures on the integrated circuit. The width W of each diffusion region (sometimes referred to as an "oxide definition" or OD region) may be limited by the number of fins that can be formed in each diffusion region. The number of fins is sometimes referred to as the number of fingers or "diffusion grids" (DG) that limits the maximum width of a single diffusion region. In the example of FIG. 8, the maximum width is limited to 2 diffusion grids. This is merely illustrative and does not serve to limit the scope of the present invention. In other embodiments, each diffusion region 606 may include more than two fingers, at least four fingers, eight or more fingers, etc.

Referring back to FIG. 7, electrical contacts may be formed to bias the diffusion regions 606 and the gate conductors 700 to a power supply voltage Vsup (as illustrated schematically by dotted path 702). For example, an n-type FinFET guard ring may have structures that are biased to a positive power supply voltage (e.g., Vsup is set to positive power supply voltage Vcc). As another example, a p-type FinFET guard ring may have structures that are biased to a ground power supply voltage (e.g., Vsup is set to ground voltage Vss). If desired, voltage Vsup may be adjusted to some intermediate voltage level between Vcc and Vss, to some elevated voltage level that is greater than Vcc, or to some negative voltage level that is less than Vss to ensure proper operation of the nonplanar guard ring.

The column arrangement of FIG. 7 may exhibit gaps 610 between each adjacent pair of interlocked L-shaped regions 606. The presence of gaps 610 may require at least two diffusion columns 604 to be formed along a particular edge of the nonplanar guard ring, where the two columns are laterally offset from one another (as shown in the dual-column edge embodiment of FIG. 6) to help block noise that can potentially propagate through those gaps.

Figure 9:
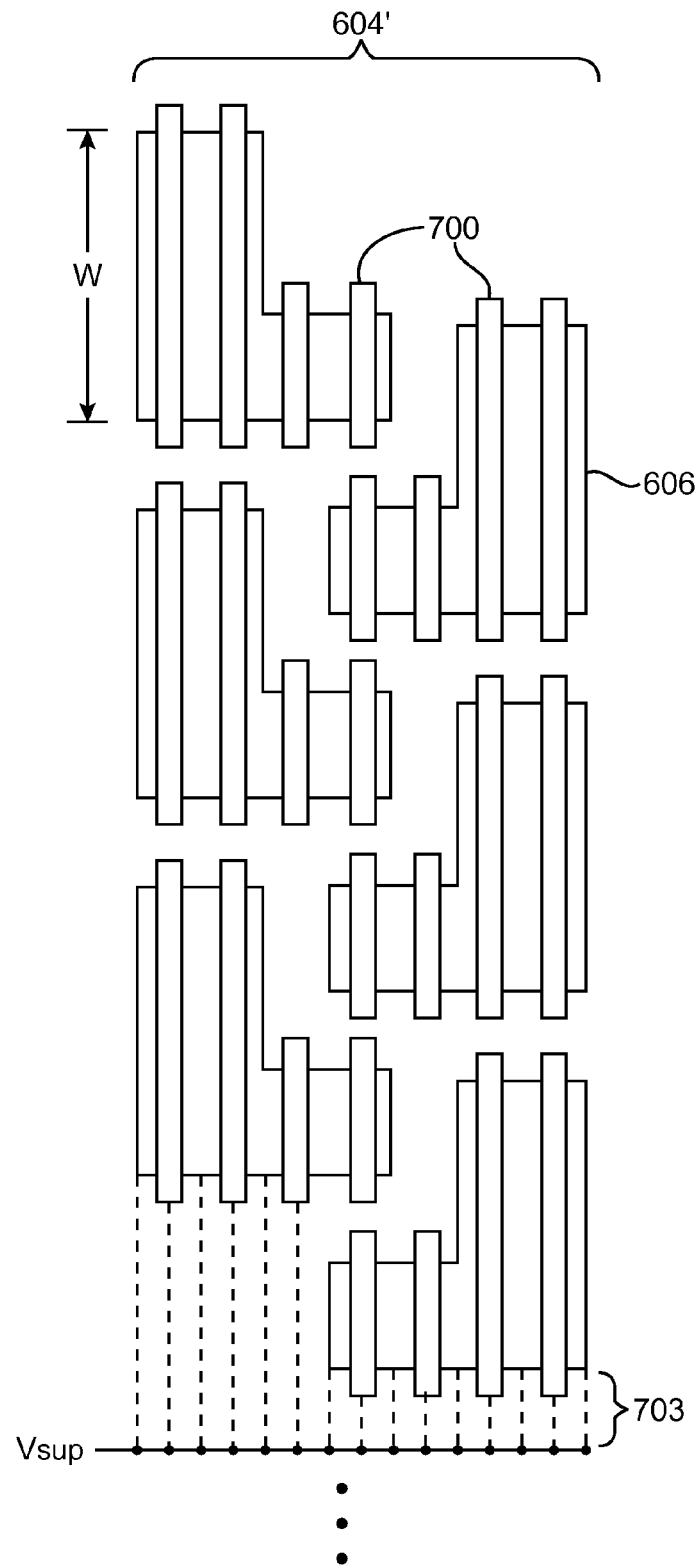
FIG. 9 is a diagram of an illustrative guard ring column having staggered L-shaped diffusion regions in accordance with an embodiment.

FIG. 9 shows another suitable arrangement of a guard ring diffusion column 604' that includes staggered L-shaped regions 606. As shown in FIG. 9, each successive L-shaped region 606 may be vertically staggered with respective to one another. Multiple gate structures such as gate conductors 700 may be formed over diffusion regions 606. Formed in this staggered configuration, all direct noise leakage paths between adjacent L-shaped regions 606 within column 604' are effectively eliminated. As a result, this staggered arrangement allows for only one diffusion column 604' to be formed along a particular edge of a nonplanar guard ring while still providing satisfactory noise isolation.

Figure 10:
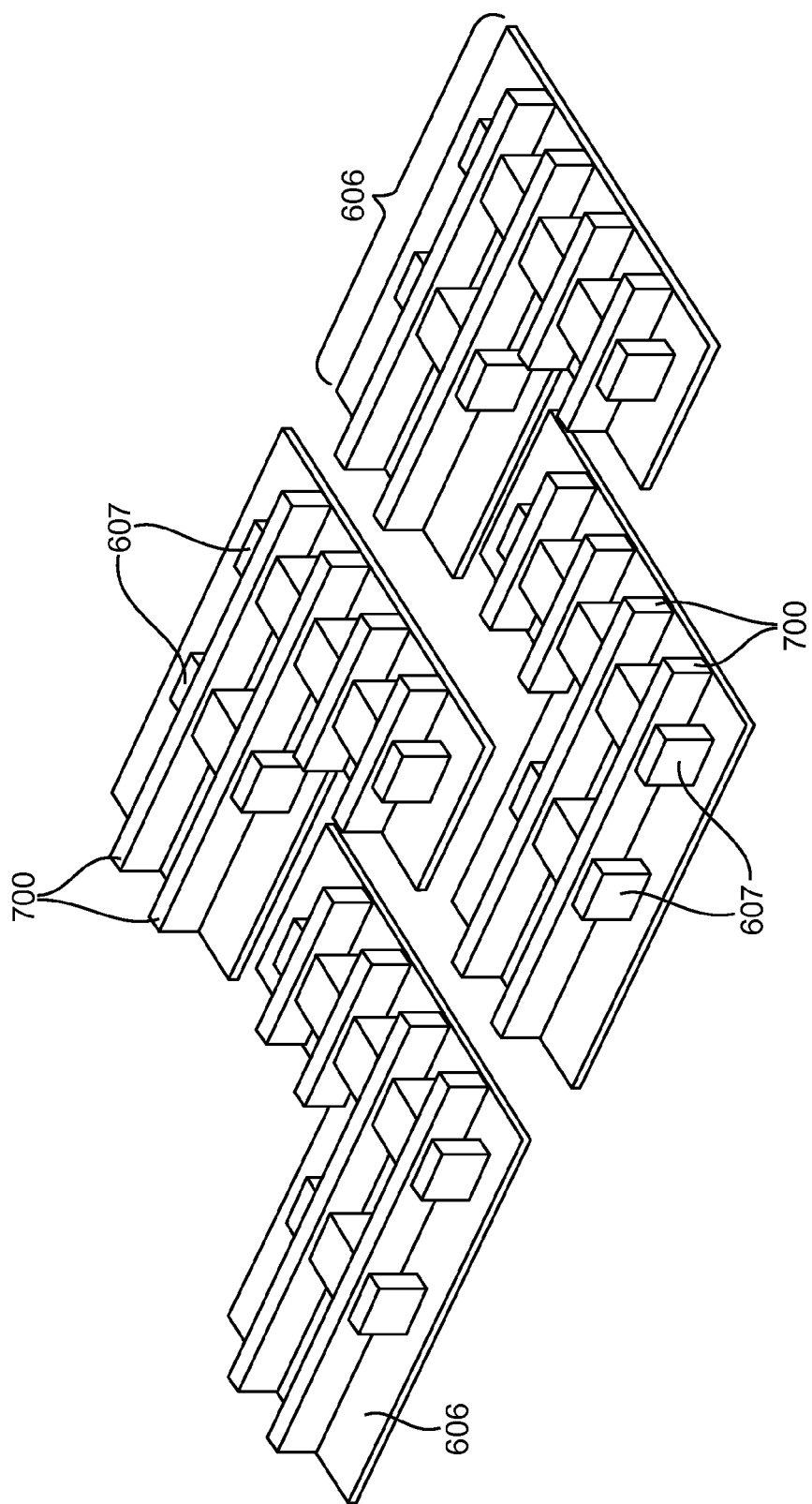
FIG. 10 is a perspective view of the guard ring diffusion column of FIG. 9 in accordance with an embodiment.

FIG. 10 is a perspective view of the guard ring diffusion column of FIG. 9. As shown in the perspective view of FIG. 10, two source-drain fin structures 607 may be formed under the gate conductors 700 in each diffusion region 606. The example of FIG. 10 is also limited to two diffusion grids. This is merely illustrative and does not serve to limit the scope of the present invention. In other embodiments, each diffusion region 606 may include more than two fins, at least four fins, eight or more fins, etc.

Referring back to FIG. 9, electrical contacts may be formed to bias the diffusion regions 606 and the gate conductors 700 to a power supply voltage Vsup (as illustrated schematically by dotted path 703). For example, an n-type FinFET guard ring that includes a staggered diffusion column 604' may have structures that are biased to a positive power supply voltage (e.g., Vsup is set to positive power supply voltage Vcc). As another example, a p-type FinFET guard ring that includes staggered diffusion column 604' may have structures that are biased to a ground power supply voltage (e.g., Vsup is set to ground voltage Vss). If desired, voltage Vsup may be adjusted to some intermediate voltage level between Vcc and Vss, to some elevated voltage level that is greater than Vcc, or to some negative voltage level that is less than Vss to ensure proper operation of the nonplanar guard ring.

In general, one or more edges of a nonplanar guard ring may be formed using the diffusion column of FIGS. 7 and 8 or may be formed using the diffusion column shown in FIGS. 9 and 10. If desired, one edge of the non-planar guard ring may be formed using the diffusion column of FIGS. 7 and 8, whereas another (opposing) edge of the nonplanar guard ring may be formed using the diffusion column of FIGS. 9 and 10. In other words, the configurations of FIGS. 7-10 may be combined into a single embodiment.

The embodiments of FIGS. 6-10 in which the nonplanar guard ring 600 is formed using rectangular diffusion strips and L-shaped diffusion regions are merely illustrative and do not serve to limit the scope of the present invention. If desired, diffusion regions of other shapes such as short rectangular diffusion stubs, T-shaped diffusion regions, Z-shaped diffusion regions, cross-shaped diffusion regions, other non-rectangular diffusion regions, or other suitably shaped diffusion regions can be used. In general, different types of nonplanar guard rings such as n-type FinFET guard rings, p-type FinFET guard rings, np-type FinFET guard rings, pnp-type FinFET guard rings, or npn-type FinFET guard rings may be formed using the configurations of the type described in connection with FIGS. 6-10 to help provide desired noise isolation for nonplanar transistor devices on an integrated circuit.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

The foregoing is merely illustrative of the principles of this invention and various modifications can be made by those skilled in the art. The foregoing embodiments may be implemented individually or in any combination.

What is claimed is:

1. An integrated circuit, comprising:
a nonplanar transistor; and
a guard ring that surrounds the nonplanar transistor and that is configured to eliminate any direct noise leakage path between the nonplanar transistor and circuitry outside of the guard ring, wherein the guard ring has a periphery and includes a plurality of discrete diffusion regions formed along its periphery, and wherein each of the discrete diffusion regions has at least two parallel gate structures.

2. The integrated circuit defined in claim 1, wherein the nonplanar transistor comprises a Fin field-effect transistor (FinFET).

3. The integrated circuit defined in claim 1, wherein gaps exist between adjacent diffusion regions in the plurality of discrete diffusion regions.

4. The integrated circuit defined in claim 1, wherein the plurality of discrete diffusion regions comprises multiple interleaved non-rectangular diffusion regions.

5. The integrated circuit defined in claim 1, wherein the plurality of discrete diffusion regions comprises pairs of interlocking L-shaped diffusion regions.

6. The integrated circuit defined in claim 1, wherein the plurality of discrete diffusion regions comprises staggered L-shaped diffusion regions.

7. The integrated circuit defined in claim 3, wherein the plurality of discrete diffusion regions comprises L-shaped diffusion regions.

8. The integrated circuit defined in claim 7, wherein the plurality of discrete diffusion regions further comprises rectangular diffusion strips that are substantially longer than the L-shaped diffusion regions.

9. The integrated circuit defined in claim 4, wherein the multiple interleaved non-rectangular diffusion regions comprise non-rectangular diffusion regions selected from the group consisting of: L-shaped diffusion regions, T-shaped diffusion regions, Z-shaped diffusion regions, and cross-shaped diffusion regions.

10. A guard ring formed on an integrated circuit that includes nonplanar transistors, comprising:
a first guard ring edge that includes a plurality of interleaved non-rectangular diffusion regions; and
a second guard ring edge that includes a plurality of interleaved non-rectangular diffusion regions, wherein each diffusion region in the plurality of interleaved non-rectangular diffusion regions in the first and second guard ring edges includes a gate structure that is coupled to a voltage supply line.

11. The guard ring defined in claim 10, wherein the first and second guard ring edges are opposing edges of the guard ring.

12. The guard ring defined in claim 10, further comprising:
a third edge that includes rectangular diffusion regions.

13. The guard ring defined in claim 12, further comprising:
a fourth edge that includes rectangular diffusion regions, wherein the third and fourth edges are opposing edges of the guard ring.

14. The guard ring defined in claim 12, wherein the plurality of interleaved non-rectangular diffusion regions comprises diffusion regions selected from the group consisting of: L-shaped diffusion regions, T-shaped diffusion regions, Z-shaped diffusion regions, and cross-shaped diffusion regions.

15. A nonplanar guard ring, comprising:
an edge that includes a plurality of interleaved non-rectangular diffusion regions;
at least two fin structures formed in each diffusion region in the plurality of interleaved non-rectangular diffusion regions; and
a gate structure formed over the at least two fin structures in each diffusion region in the plurality of interleaved non-rectangular diffusion regions.

16. The nonplanar guard ring defined in claim 15, wherein the plurality of interleaved non-rectangular diffusion regions comprises diffusion regions selected from the group consisting of: L-shaped diffusion regions, T-shaped diffusion regions, Z-shaped diffusion regions, and cross-shaped diffusion regions.

17. The nonplanar guard ring defined in claim 15, wherein the plurality of interleaved non-rectangular diffusion regions comprises pairs of interlocking L-shaped diffusion regions.

18. The nonplanar guard ring defined in claim 15, wherein the plurality of interleaved non-rectangular diffusion regions comprises staggered L-shaped diffusion regions.

19. The nonplanar guard ring defined in claim 15, wherein the edge further includes:
an additional plurality of interleaved non-rectangular diffusion regions, wherein the plurality of interleaved non-rectangular diffusion regions and the additional plurality of interleaved non-rectangular regions are laterally offset with respective to one another to eliminate any direct noise leakage path through the nonplanar guard ring.

* * * * *